United States Patent
Perner et al.

(10) Patent No.: US 7,057,920 B2
(45) Date of Patent: Jun. 6, 2006

(54) TWO CONDUCTOR THERMALLY ASSISTED MAGNETIC MEMORY

(75) Inventors: Frederick A. Perner, Palo Alto, CA (US); Thomas C. Anthony, Sunnyvale, CA (US); Robert C Walmsley, Palo Alto, CA (US); Lung Tran, Sarratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 200 days.

(21) Appl. No.: 10/832,912

(22) Filed: Apr. 26, 2004

(65) Prior Publication Data

US 2005/0237795 A1    Oct. 27, 2005

(51) Int. Cl.
*G11C 11/14* (2006.01)
(52) U.S. Cl. ..................................... 365/158; 365/171
(58) Field of Classification Search ............... 365/117, 365/65, 145, 158, 225.5, 171
See application file for complete search history.

(56) References Cited

U.S. PATENT DOCUMENTS

| | | | |
|---|---|---|---|
| 6,081,445 A | 6/2000 | Shi et al. | |
| 6,114,719 A * | 9/2000 | Dill et al. | 257/295 |
| 6,163,477 A | 12/2000 | Tran | |
| 6,385,082 B1 | 5/2002 | Abraham et al. | |
| 6,535,416 B1 | 3/2003 | Daughton et al. | |
| 6,603,678 B1 | 8/2003 | Nickel et al. | |
| 6,771,534 B1 * | 8/2004 | Stipe | 365/158 |
| 2003/0007398 A1 | 1/2003 | Daughton et al. | |
| 2005/0174836 A1 * | 8/2005 | Sharma et al. | 365/171 |
| 2005/0180238 A1 * | 8/2005 | Perner et al. | 365/211 |
| 2005/0213375 A1 * | 9/2005 | Perner et al. | 365/158 |

OTHER PUBLICATIONS

R.H. Koch et al. "Thermally Assisted Magnetization Reversal in Submicron-Sized Magnetic Thin Films," Phys. Rev. Lett., pp. 5419-5422, vol. 84, No. 23, Jun. 5, 2000.

* cited by examiner

*Primary Examiner*—Richard Elms
*Assistant Examiner*—Alexander Sofocleous (57) ABSTRACT

A method of performing a thermally assisted write operation on a selected two conductor spin valve memory (SVM) cell having a material wherein the coercivity is decreased upon an increase in temperature. In a particular embodiment, a first write magnetic field is established by a first write current flowing from a first voltage potential to a second voltage potential as applied to the first conductor. A second write magnetic field is established by a second write current flowing from a third voltage potential to a fourth voltage potential as applied to the second conductor. The voltage potential of the first conductor is greater than the voltage potential of the second conductor. As a result, a third current, flows from the first conductor through the SVM cell to the second conductor. The SVM cell has an internal resistance such that the flowing current generates heat within the SVM cell. As the SVM cell is self heated, the coercivity of the SVM cell falls below the combined write magnetic fields.

34 Claims, 7 Drawing Sheets

TWO CONDUCTOR THERMALLY ASSISTED MAGNETIC MEMORY

FIELD OF THE INVENTION

This invention relates generally to magnetic memory devices (commonly referred to as "MRAM") in a two conductor architecture.

BACKGROUND

Increasingly sophisticated computer systems permit users to perform an expanding variety of computing tasks at faster and faster rates. The size of the memory and the memory access speed bear heavily upon the overall speed of the computer system.

One principle underlying data storage in magnetic media (main or mass storage) is the ability to change and/or reverse the relative orientation of the magnetization of a storage data bit, (i.e. the logic state of a "0" or a "1"). The coercivity of a material is the level of demagnetizing force that must be applied to a magnetic particle to reduce and/or reverse the magnetization of the particle. Generally speaking, the smaller the magnetic particle, the higher its coercivity.

Figure 1A:
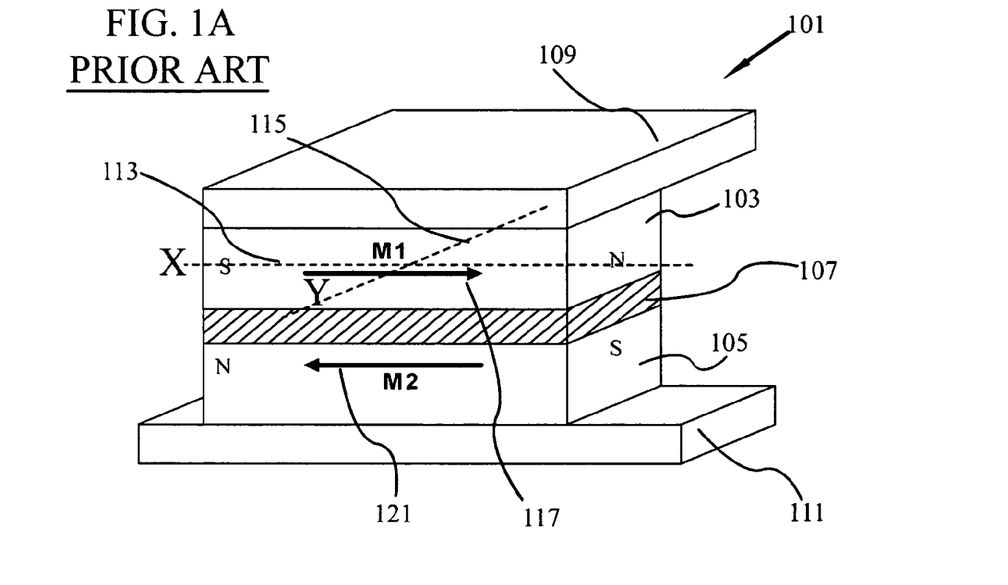
FIGS. 1A–1B show perspective views of a prior art magnetic memory cell having two conductors.
Figure 1B:
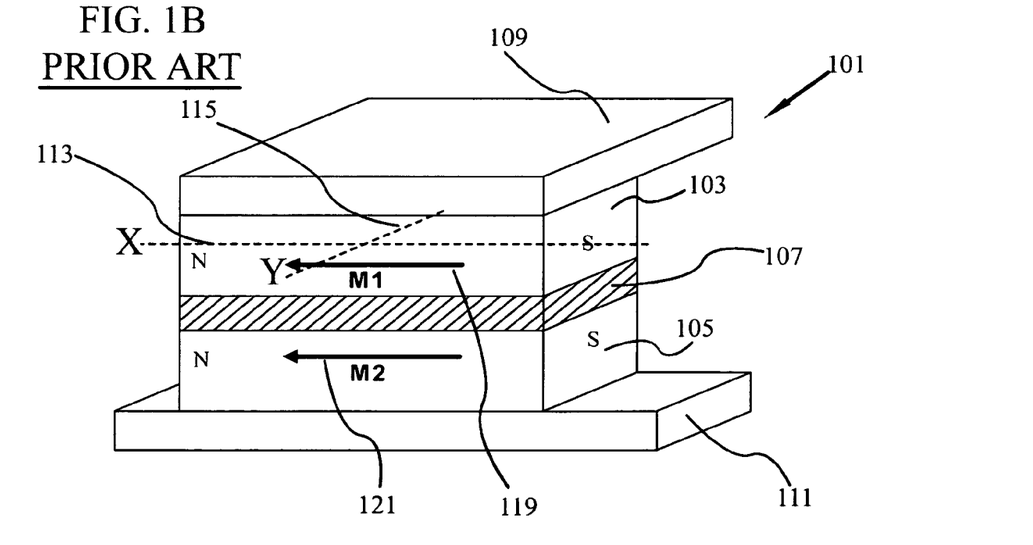

Known magnetic memory cells may be tunneling magneto-resistance memory cells (TMR), giant magneto-resistance memory cells (GMR), or colossal magneto-resistance memory cells (CMR). These types of magnetic memory are commonly referred to as spin valve memory cells (SVM). FIGS. 1A and 1B provide a perspective view of a typical prior art magnetic memory cell having two conductors.

As shown in prior art FIGS. 1A and 1B, a magnetic spin valve memory (SVM) cell 101 generally includes a data layer 103 which may alternatively be called a storage layer or bit layer, a reference layer 105 and an intermediate layer 107 between the data layer 103 and the reference layer 105. The data layer 103, the reference layer 105 and the intermediate layer 107 can be made from one or more layers of material.

Where wiring layers are provided in a grid of rows and columns, electrical current and magnetic fields may be applied to the SVM cell 101 via electrically conductive row conductor 109 and electrically conductive column conductor 111. It is understood and appreciated that, as used herein, the terms row and column conductor have been selected for ease of discussion. Under appropriate circumstances, these labels may be reversed and/or otherwise substituted for such titles as word line and bit line.

Using photolithographic techniques, the single SVM cell 101 shown in FIGS. 1A and 1B is typically combined with a plurality of other substantially identical SVM cells. In a typical MRAM device, the SVM cells are arranged in a cross-point array. Parallel conductive columns (column 1, 2, 3 . . . i not shown), also referred to as word lines, cross parallel conductive rows (row A, B, C . . . i not shown), also referred to as bit lines. The traditional principles of column and row arrays dictate that any given row will only cross any given column once.

An SVM cell is placed at each intersecting cross-point between a row and a column. By selecting a particular row (B) and a particular column (3), any one memory cell positioned at their intersection (B, 3) can be isolated from any other memory cell in the array. Such individual indexing is not without complexities.

The data layer 103 is usually a layer of magnetic material that stores a bit of data as an orientation of magnetization M1 that may be altered in response to the application of an external magnetic field or fields. More specifically, the orientation of magnetization M1 of the data layer 103 representing the logic state can be rotated (switched) from a first orientation 117, as in FIG. 1A, representing a logic state of "0", to a second orientation 119, as in FIG. 1B representing a logic state of "1", and/or vice versa.

The reference layer 105 is usually a layer of magnetic material in which an orientation of magnetization M2 is "pinned", as in fixed, in a predetermined direction or pinned orientation 121. The direction is predetermined and established by conventional microelectronic processing steps employed in the fabrication of the magnetic memory cell.

The data layer 103 and reference layer 105 may be thought of as stacked bar magnets, each long on an X axis 113 and short on a Y axis 115. The magnetization of each layer has a strong preference to align along the easy axis, generally the long X axis 113. The short Y axis 115 is generally the hard axis. Alignment of the orientation of magnetization M1 of the data layer 103 in the first orientation 117 or second orientation 119 requires substantially the same amount of energy, and thus requires the same external magnetic field, to align the spins of the atomic particles in either direction.

Typically, the logic state (a "0" or a "1") of a magnetic memory cell depends on the relative orientations of magnetization M1 in the data layer 103 and M2 of the reference layer 105 (117 to 121 as shown in FIG. 1A or 119 to 121 as shown in FIG. 1B). For example, when an electrical potential bias is applied across the data layer 103 and the reference layer 105 in an SVM cell 101, electrons migrate between the data layer 103 and the reference layer 105 through the intermediate layer 107. The intermediate layer 107 is typically a thin dielectric layer, which is commonly referred to as a tunnel barrier layer. The phenomenon that causes the migration of electrons through the barrier layer may be referred to as quantum mechanical tunneling, or spin tunneling.

The logic state may be determined by measuring the resistance of the SVM cell 101. For example, if the orientation 119 of the magnetization M1 in the data layer 103 is parallel to the pinned orientation 121 of magnetization in the reference layer 105, the SVM cell 101 will be in a state of low resistance, R (see FIG. 1B). If the first orientation 117 of the magnetization M1 in the data layer 103 is anti-parallel (opposite) to the pinned orientation 121 of magnetization in the reference layer 105, the SVM cell 101 will be in a state of high resistance, R+ΔR (see FIG. 1A). The orientation of M1, and therefore the logic state of the SVM cell 101, may be read by sensing the resistance of the SVM cell 101.

Generally speaking, the smaller the magnetic particle, the higher its coercivity. A large coercivity is generally undesirable as it requires a greater magnetic field to facilitate switching, which in turn requires a greater power source and potentially larger conductors. Providing a large power source and large conductors is generally at odds with attempts to reduce the necessary size of components, and therefore permit larger memory stores in smaller and smaller spaces.

In addition, the coercivity of a magnetic particle may be affected by temperature. Generally as temperature increases, coercivity decreases. With respect to MRAM and SVM cells, elevating the temperature of an SVM cell may indeed reduce the coercivity. The heating of an SVM cell 101 within an MRAM array may generally be accomplished through either of two forms.

The first form is generalized heating where the desired SVM cell is heated collectively along with unselected/ undesired SVM cells. In the most basic setting, the entire memory array is heated. Such generalized heating reduces the coercivity of unselected SVM cells along with the selected SVM cell and therefore may permit inadvertent and undesirable switching of unselected SVM cells, commonly referred to as half-select errors.

The second form is selected heating where the desired SVM cell is heated independently of the unselected SVM cells within the memory. Such selected heating is traditionally accomplished with the use of movable heating probes or other external heaters which can provide a localized heat directly to a selected SVM cell, additional heating conductors and or elements placed proximately to the SVM cells of the memory, and/or the application of a heating pulse briefly passed through a selected SVM cell. The heating of a selected SVM cell 101 may therefore lower the coercivity of the cell and permit lower intensity magnetic fields to affect the magnetic orientation of the heated SVM cell 101 while not inadvertently affecting unselected and unheated SVM cells.

Movable probes and external heaters are generally not practical for commercial memory applications requiring fast write response times, as there is an inherent latency due to the movement of the heating device. Additional heating conductors and/or heat elements disposed proximate to the SVM cells, though effective, require additional space within the memory device structure as well as requiring additional fabrication processes that likely increase costs.

Heating pulses are typically brief to avoid over-load of the SVM cell and/or the electrical conductors coupled to the SVM cell. Brief heating pulses must additionally elevate the temperature of the SVM cell sufficiently to remain warm during the write operation when the heating pulse is not present. As time is a factor in a write operation, environmental factors may increase the cooling rate of the SVM cell and thus degrade the effectiveness of the heating pulse.

Hence, there is a need for an ultra-high density magnetic memory which overcomes one or more of the drawbacks identified above.

SUMMARY

The present disclosure advances the art and overcomes problems articulated above by providing a two conductor thermally assisted magnetic memory device.

In particular, and by way of example only, according to an embodiment of the present invention, this invention provides a method of performing a thermally assisted write operation on a selected two conductor spin valve memory (SVM) cell having a data layer characterized by an alterable orientation of magnetization, wherein the coercivity of the data layer is decreased during a write operation by heating the data layer as a result of current flowing through the selected two conductor SVM cell. The data layer in the SVM cell has a stable orientation and high coercivity below a threshold temperature, and an alterable orientation and low coercivity above a threshold temperature. The method including: applying a first differential voltage across a first conductor generating a first write magnetic field; applying a second differential voltage across a second conductor generating a second write magnetic field, the second differential voltage applied contemporaneously with the first differential voltage; heating the SVM cell to the threshold temperature with a heating current flowing from the first conductor to the second conductor through the SVM cell, the SVM cell having a resistive property providing internal self heating to the SVM cell; and orienting the magnetization of the SVM cell, the combined first and second write fields being greater than the coercivity of the heated SVM cell such that the orientation of the magnetization of the SVM cell may be changed to align with the applied first and second magnetic fields.

DETAILED DESCRIPTION

Before proceeding with the detailed description, it is to be appreciated that the present teaching is by way of example, not limitation. The concepts herein are not limited to use or application with a specific type of magnetic memory. Thus, the instrumentalities described herein are for the convenience of explanation, shown and described with respect to exemplary embodiments. It will be appreciated that the principals herein may be equally applied in other types of magnetic memory.

Figure 2:
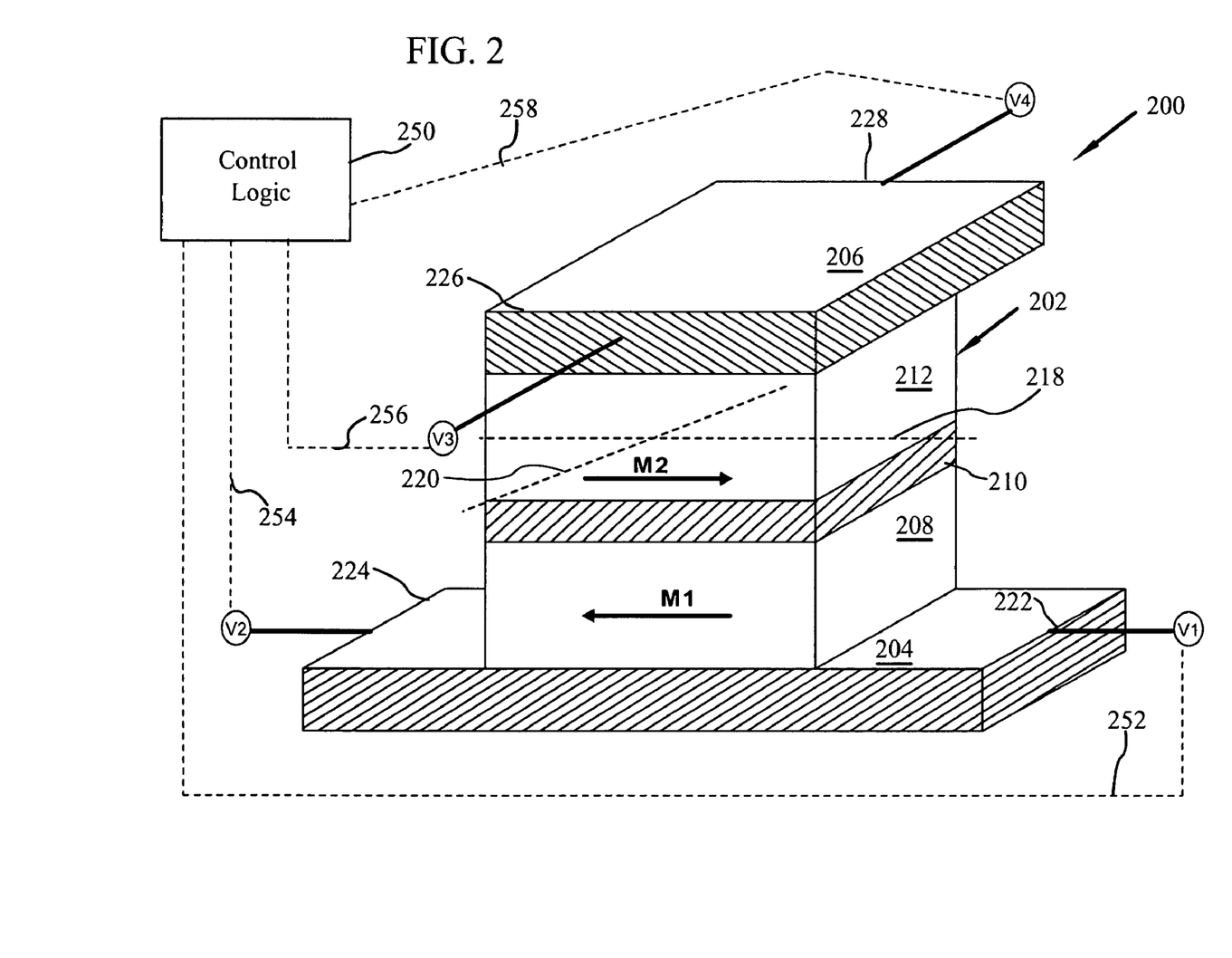
FIG. 2 provides a partial perspective view of a two-conductor spin valve memory (SVM) cell set for writing according to one embodiment.

Referring now to the drawings, and more particularly to FIG. 2, there is shown a portion of a magnetic memory 200 having at least one spin valve magnetic memory (SVM) cell 202 having an electrically conductive first conductor 204 and an electrically conductive second conductor 206.

The SVM cell 202 has a ferromagnetic data layer 208, an intermediate layer 210 and a reference layer 212. The data layer 208 permits the storing of a bit of data as an alterable orientation of magnetization M1. The intermediate layer 210 has opposing sides such that the data layer 208 in contact with one side is in direct alignment with, and substantially uniformly spaced from, the reference layer 212 in contact with the second side of the intermediate layer 210.

The reference layer 212 provides a reference orientation of magnetization M2. In at least one embodiment, the reference layer 212 is a pinned reference layer, having a set orientation of magnetization M2. In an alternative embodiment the reference layer is a soft reference layer having a non-pinned orientation of magnetization M2.

With respect to a traditional bar magnet, there are two equally stable easy spin directions (each rotated 180 degrees) along the easy axis, generally the longer axis of the magnet—the shorter axis being the hard axis. Alignment in either direction requires the same energy and requires the same external magnetic field to align the spins of the atomic particles in either direction.

The data layer 208 is typically made of a ferromagnetic (FM) material. The data layer 208 comprises a material providing a stable orientation and a high coercivity below a threshold temperature, and an alterable orientation and low coercivity above a threshold temperature. In addition the data layer 208 is characterized as having an easy axis 218 and a hard axis 220. In at least one embodiment, the easy axis 218 and hard axis 220 of the data layer 208 define the easy axis and hard axis of the overall SVM cell 202. The hysteresis loop of the data layer 208 is substantially symmetric, such that there are two substantially equivalent easy directions for magnetic alignment along the easy axis.

The magnetic orientation M1 of the data layer 208 can be oriented in a chosen direction along generally the easy axis 218 when an appropriate magnetic field is applied, and remain in that orientation when the field is removed. More specifically, the orientation M1 is set by applying a magnetic field that overcomes the coercivity of the data layer 208, Hc(data). In short, the magnetic orientation M1 of the data layer 208 is alterable, but will be maintained in the last state of orientation.

The first conductor 204 has a first end 222 and a second end 224. Similarly the second conductor 206 has a first end 226 and a second end 228. In at least one embodiment, the first conductor 204 is parallel to the easy axis 218 and the second conductor 206 is parallel to the hard axis 220. Moreover, the first conductor 204 is transverse to the second conductor 206, an arrangement more fully appreciated with respect to FIG. 3, described below.

In addition, the SVM cell 202 may be described as having a top and a bottom. As shown in FIG. 2, the first conductor 204 is electrically coupled to the bottom of the SVM cell 202 and the second conductor 206 is electrically coupled to the top of the SVM cell 202. In an alternative embodiment, these connections may be flipped such that the first conductor 204 is attached to the top and the second conductor 206 to the bottom.

A first voltage potential (V1) is switchably coupled to the first end 222 of the first conductor 204. A second voltage potential (V2) is switchably coupled to the second end 224 of the first conductor 204. A third voltage potential (V3) is switchably coupled to the first end 226 of the second conductor 206. A fourth voltage potential (V4) is switchably coupled to the second end 228 of the second conductor 206.

An appropriate control logic 250, including a write circuit, is coupled to each voltage potential (V1, V2, V3, V4) source to control the application of a voltage potential to each end 222, 224 of the first conductor 204 and each end 226, 228 of the second conductor 206. As shown, control logic 250 is coupled to each voltage potential (V1, V2, V3, V4) source by control lines 252, 254, 256 and 258. Each control line is represented as a dotted line as each voltage potential (V1, V2, V3, V4) may be independently controlled by the control logic 250.

Figure 3:
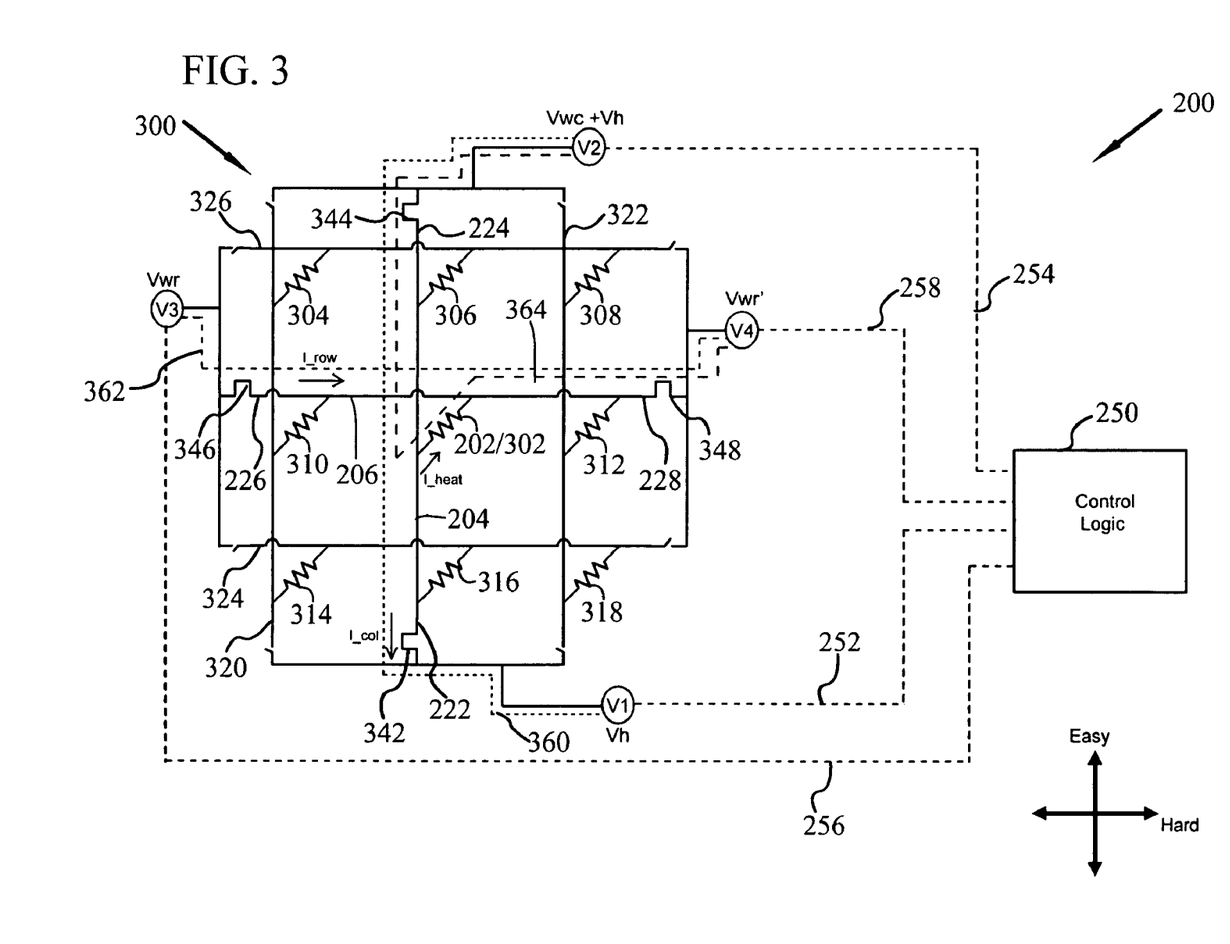
FIG. 3 provides a conceptual illustration of a cross-point array of two-conductor SVM cells shown in FIG. 2.

FIG. 3 provides a conceptual illustration of a cross-point array 300 of magnetic memory 200 including spin valve memory (SVM) cells 202 as shown in FIG. 2. Each SVM cell 202 is represented as a resistor 302, 304, 306, . . . 318. The cross-point array 300 includes a plurality of parallel electrically conductive first conductors 204, 320 and 322 that may reside at a shared level or depth in the memory structure. A plurality of parallel electrically conductive second conductors 206, 324 and 326 in a second level or depth cross the first conductors 204, 320 and 322 thereby forming a cross-point array with a plurality of intersections.

In at least one embodiment, the first conductors (204, 320, 322) are transverse to the second conductors (206, 324 326), and may be transversely normal or perpendicular in plan view. The first conductors (204, 320 322) may be described as conductive columns or conductive bit lines. The second conductors (206, 324 326) may be described as conductive rows or conductive word lines.

Each SVM cell/resistor 302 through 318 is in electrical contact with, and located at, an intersection between a given first conductor 204, 320, and 322 and a given second conductor 206, 324, and 326. By way of example, one such intersection is shown at resistor 302 between first conductor 204 and second conductor 206. As such, electrical current and magnetic fields may be provided to a selected SVM cell represented by resistor 302 within the cross-point array 300 by first conductor 204 and second conductor 206. Although shown as a three by three cross-point array, it is understood and appreciated that the actual array may consist of substantially more first and second conductors. For example, cross-point array 300 may be a 16 KB, 32 KB, 64 KB, 128 KB, 256 KB or larger memory array.

As indicated with the discussion of FIG. 2, each first conductor, for example first conductor 204, has a first end 222 and a second end 224. Likewise each second conductor, for example second conductor 206, has a first end 226 and a second end 228.

The selection of first conductor 204 is facilitated, for example, by switching element 342 connecting to the first end 222 of first conductor 204 and switching element 344 connecting to the second end 224 of first conductor 204 (see also FIG. 2 for arrangement of conductors and first and second ends). Similarly, the selection of second conductor 206 is facilitated by switching element 346 connecting to the first end 226 of second conductor 206 and switching element 348 connecting to the second end 228 of second conductor 206. Control of each switching element (342, 344, 346, 348) is provided by the control logic 250 and control lines 252, 254, 256 and 258. For example, control line 252 is coupled to first voltage potential V1 to dynamically adjust V1 as it is applied through switch element 342 to the first end 222 of first conductor 204. Similarly control line 254 is coupled to second voltage potential V2 to dynamically adjust V2 as it is applied through switch element 344 to the second end 224 of first conductor 204. The dynamic adjustment of each voltage potential (V1, V2, V3, V4) by the control logic 250 is more fully described below.

In at least one embodiment, an advantageous write process may be performed upon selected SVM cell 202 wherein the SVM cell 202 is heated contemporaneously with the application of magnetic fields. The method of selectively heating a specific cell and selectively applying magnetic fields may be more fully appreciated with respect to the flowchart provided in FIG. 4 in connection with FIG. 3 and FIG. 5.

It will be appreciated that the described method need not be performed in the order in which it is herein described, but that this description is merely exemplary of at least one method of performing a thermally assisted write operation on a selected two conductor SVM cell 202 characterized by an alterable orientation of magnetization and comprising a material providing a stable orientation and high coercivity below a threshold temperature, and an alterable orientation and low coercivity above a threshold temperature.

Figure 4:
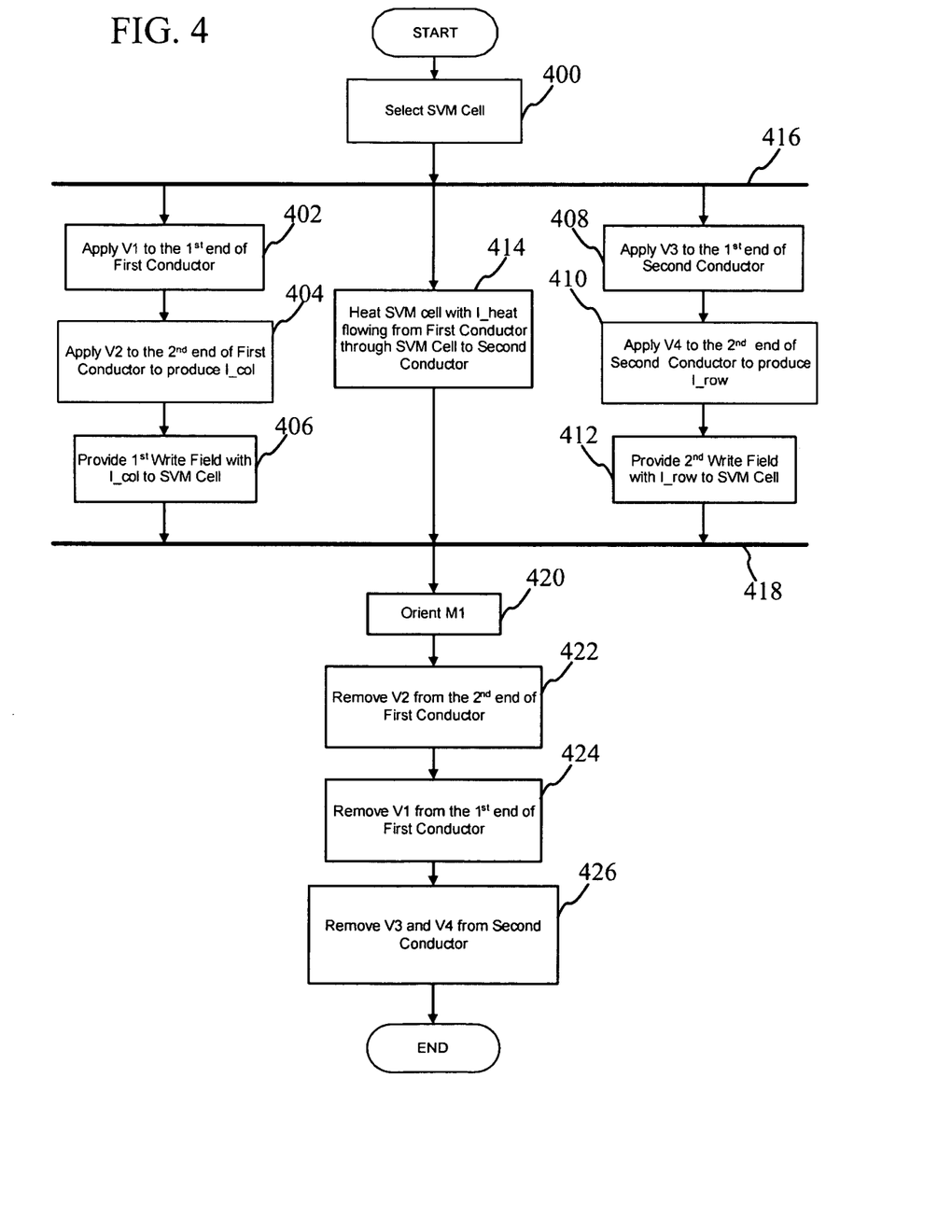
FIG. 4 provides a flowchart depicting the steps of thermally assisting the write process for a two conductor SVM cell.

Under appropriate circumstances, such as where a sense operation has already been performed upon a selected SVM cell 202, and the requisite first conductor 204 and second conductor 206 intersecting the SVM cell 202 are known, the method may commence immediately. In other circumstances where a specific SVM cell 202 is known but unselected, the SVM cell must be selected as shown in block 400.

Figure 5:
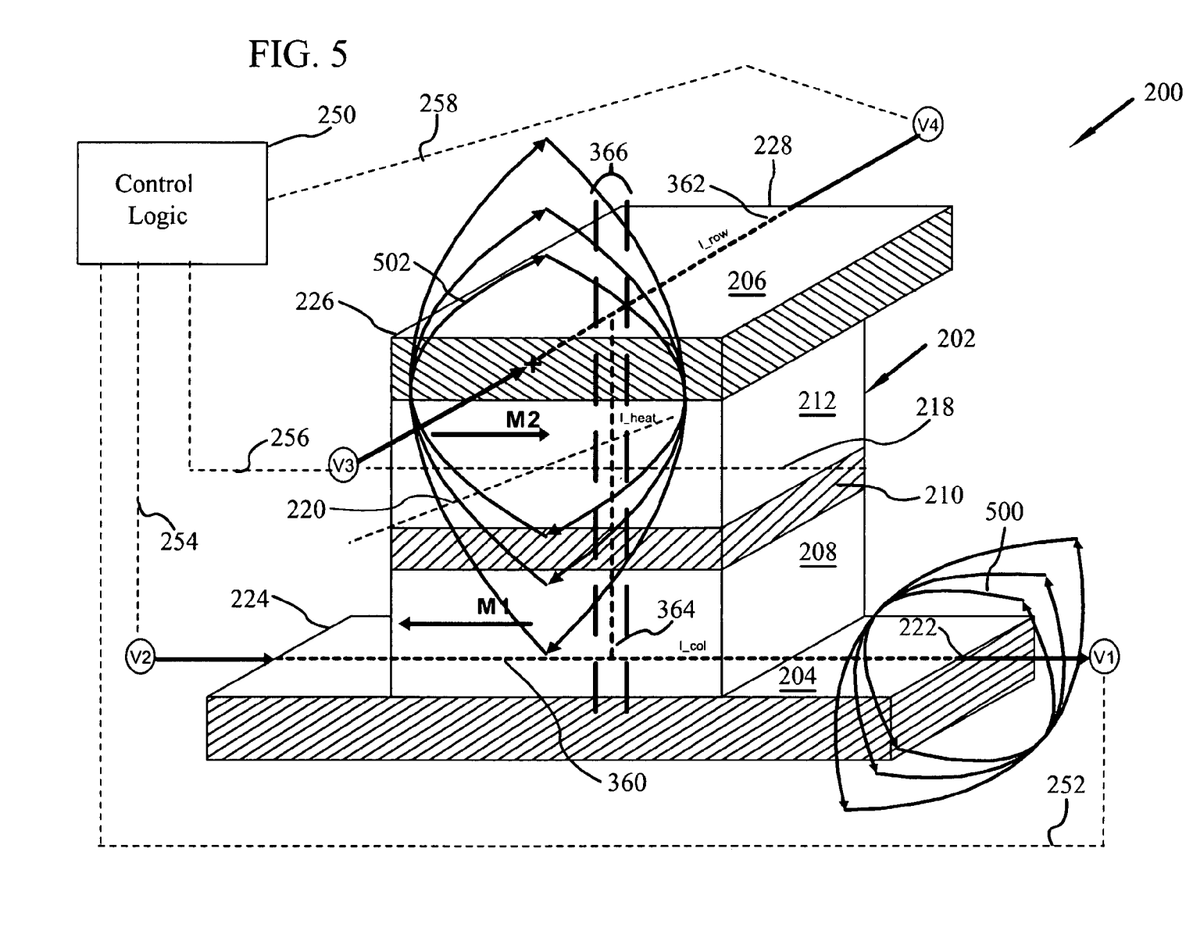
FIG. 5 provides a partial perspective view of the SVM cell in FIG. 2 undergoing the write operations set forth in FIG. 4.

In either case the selection is accomplished with appropriate control logic 250 directing switching elements 342, 344, 346 and 348 to switchably select specific first conductor 204 and specific second conductor 206. FIG. 5 conceptually illustrates the perspective view of a selected SVM cell 202 as described above and initially shown in FIG. 2.

With an SVM cell 202 selected, the application of specific voltage potentials may commence substantially contemporaneously. More specifically, a first voltage potential V1 is applied to the first end 222 of first conductor 204, as shown in block 402. In at least one embodiment, V1 is a heating voltage potential (Vh).

Second voltage potential V2 is applied to the second end 224 of the first conductor 204, as shown in block 404. As the first conductor 204 may be described as a column, in at least one embodiment, V2 is a write column potential and a heating potential (Vwc+Vh).

V2 is higher in potential than V1 such that a current (I_col) flows in the first conductor 204, providing a first write magnetic field 500, represented as circling arrows in FIG. 5, as shown in block 406. I_col 360 is illustrated as a dotted line, shown in FIGS. 3 and 5. As I_col 360 is shown flowing from left to right in FIG. 5, the first write magnetic field 500 flows in a counterclockwise orientation about first conductor 204 in accordance with the right hand rule. The first write magnetic field 500 is applied along the hard axis 220 of SVM cell 202.

The control logic 250 dynamically adjusts V1 and V2 to be unequal and thus provides for I_col. As described the relationship is V2>V1, however this may be reversed by the control logic 250.

A third voltage potential V3 is applied to the first end 226 of the second conductor 206, as shown in block 408. As the second conductor 206 may be described as a row, in at least one embodiment, V3 is a write row potential (Vwr). In addition, the potential V3 is less than V1.

A fourth voltage potential V4 (Vwr') is applied to the second end 228 of the second conductor 206, as shown in block 410. The potential of V4 is less than the potential V1. In addition, so as to achieve the flow of current I_row 362, represented as a dotted line in FIG. 3 and FIG. 5, the potential of V4 and the potential of V3 are unequal. In one embodiment, the potential of V4 is greater than the potential of V3. In an alternative embodiment, the potential of V4 is less than the potential of V3.

The relationship of the four voltage potentials operating during a write operation may be further summarized as follows (note V3≠V4):

$V1 > V2 > (V3 \& V4)$ $V2 > V1 > (V3 \& V4)$ $|V1-V2|=\Delta V\_col$ $|V3-V4|=\Delta V\_row$ $\Delta V\_col > \Delta V\_row$ $\Delta V\_col - \Delta V\_row = \Delta V\_heat$ As V1 and V2 are both greater than V3 and V4, there exists a voltage potential drop across the SVM cell 202. As such, a third current, I_heat 264, will flow from the first conductor 204 through the SVM cell 202 to the second conductor 206. The heater component Vh of V1 and V2, providing I_heat to the given SVM cell 202, is not a leakage current. Vh is purposefully selected to generate a specific heat, raising the temperature of the specific SVM cell 202 to a specified threshold temperature for the SVM cell 202.

As stated above, the SVM cell 202 has a stable orientation and high coercivity below a threshold temperature, and an alterable orientation and low coercivity above a threshold temperature. Though coercivity generally decreases as temperature increases, the threshold temperature for the SVM cell 202 is established to be high enough that inadvertent leakage currents and fluctuations in ambient temperature will not inadvertently raise the temperature of the SVM cell 202 to the threshold temperature. More specifically, in at least one embodiment, the Vh component may be close to the dielectric breakdown voltage of the SVM cell 202. Under appropriate circumstances, the appropriate level of Vh may be determined by a feedback system adjusting for the ambient temperature of the SVM cell 202.

Moreover, summarizing the above, following the selection of a given SVM cell 202, in at least one embodiment, a first write current I_col 360 is applied through the first conductor 204 proximate to the SVM cell 202 to provide a first write magnetic field 500. The first write current I_col 360 is established by providing a first voltage potential V1 to the first end 222 of the first conductor 204 and a second voltage potential V2 to the second end 224 of the first conductor 204.

A second write current I_row 362 is applied through the second conductor 206 proximate to the SVM cell 202 to provide a second write magnetic field 502. The second write current I_row 362 is established by providing a third voltage potential V3 to the first end 226 of the second conductor 206 and a fourth voltage potential V4 to the second end 228 of the second conductor 206. V3 and V4 are less than either V1 or V2 such that the first conductor 204 has a higher voltage potential than the second conductor 206. As shown in FIG. 5, the potential of V4 is less than the potential of V3 such that I_row 362 is flowing into the page, as indicated by the "+" sign. The flow of I_row 362 in the second conductor 206 provides a second write magnetic field 502, represented as circling arrows in FIG. 5, flowing clockwise in accordance with the right hand rule, shown in block 412.

As shown in FIG. 5, the second write magnetic field 502 is applied along the easy axis 218 of SVM cell 202. The first write magnetic field 500 cooperatively interacts with the second write magnetic field 502, at the intersection of the first conductor 204 and the second conductor 206. As SVM cell 202 is located at this intersection, SVM cell 202 enjoys the cooperative field effect.

It is understood that each SVM cell along the first conductor 204 will be subjected to the first write magnetic field 500. Likewise, each SVM cell along the second conductor 206 will be subjected to the second write magnetic field 502. To advantageously reduce inadvertent alteration of the magnetic orientation of unselected SVM cells (known as a half-select error), each write magnetic field 500 and 502 is separately insufficient to overcome the coercivity of an SVM cell's data layer. In addition, to further reduce the possibility of an inadvertent change in orientation in unselected SVM cells proximate to the selected SVM cell 202, the combined magnitude of the first write magnetic field 500 and the second write magnetic field 502 are insufficient to overcome the coercivity of an unheated unselected SVM cell.

As stated above, the applied voltage potentials may be summarized as V2>V1>(V3 or V4). Moreover, at lest three of the four applied voltage potentials are above a ground potential. As V2 and V1 are greater than V3 and V4 the voltage potential of the first conductor 204 is greater than the voltage potential of the second conductor 206. As such a third current, I_heat 264, flows from the high potential of the first conductor 204, through the SVM cell 202, to the low potential of the second conductor 206. I_heat is represented as a dotted line in FIG. 3 and FIG. 5. As SVM cell 202 has a resistive property, the passage of I_heat 364 through SVM cell 202 provides internal self heating, generating heat 366 (represented as radiant dash lines in FIG. 5) to the SVM cell 202, operation block 414.

The behavior and properties of SVM memory cells are generally well understood. Three types of SVM cells in particular are known—a tunneling magneto-resistance memory cell (TMR), a giant magneto-resistance memory cell (GMR) and colossal magneto-resistance memory cell (CMR). GMR and CMR memory cells have similar magnetic behavior but their magneto-resistance arises from different physical effects, as the electrical conduction mechanisms are different.

More specifically, in a TMR-based memory cell, the phenomenon is referred to as quantum-mechanical tunneling or spin-dependent tunneling. In a TMR memory cell, the intermediate layer 210 is a thin barrier of dielectric material through which electrons quantum mechanically tunnel between the data layer 208 and the reference layer 212.

In a GMR memory cell, the intermediate layer 210 is a thin spacer layer of non-magnetic but conducting material. Here, the conduction is a spin-dependent scattering of electrons passing between the data layer 208 and the reference layer 212, though the intermediate layer 210. In either case, the resistance between the data layer 208 and the reference layer 212 will increase or decrease depending on the relative orientations of the magnetic fields M1 and M2. It is that difference in resistance that is sensed to determine if the data layer 208 is storing a logic state of "0" or a logic state of "1".

This same resistive property is advantageously utilized to generate internal self heating for SVM cell 202. To insure heating of the SVM cell 202 without destroying or damaging the SVM cell 202, in at least one embodiment the SVM cell 202 has a high breakdown voltage. More specifically, the atoms in insulating materials, such as the intermediate layer 210 in a TMR based memory cell, have tightly-bound electrons resisting the free flow of electrons.

In at least one alternative embodiment, an additional resistive heater element (not shown) may coupled to the SVM cell 202. As I_heat 364 passing through the resistive heater device and the SVM cell 202, the resistive heater device provides additional radient heat to the SVM cell 202. This additional radient heat assists in elevating the SVM cell 202 above the threshold temperature.

However, when enough voltage is applied, any insulating material will eventually succumb to what may be termed electrical "pressure", and electron flow through the insulating material will occur. The breakdown voltage is therefore generally accepted to be the voltage at which the insulation between two conductors will fail, permitting electricity to conduct or arc through the insulator.

In at least one embodiment, the SVM cell 202 has a breakdown voltage greater than either V1 or V2. In at least one embodiment, this increased breakdown voltage is achieved by providing a double SVM cell—specifically, two SVM cells directly in series between the first conductor 204 and second conductor 206. An elevated breakdown voltage advantageously permits the SVM cell 202 to obtain sufficient power dissipation in the form of heat 366 to assist the write operation.

In at least one embodiment, the SVM cell 202 is a TMR cell wherein the intermediate layer 210 is a tunnel layer made from an electrically insulating material (a dielectric) that separates and electrically isolates the data layer 208 from the reference layer 212. Suitable dielectric materials for the dielectric intermediate layer 210 may include, but are not limited to: Silicon Oxide ($SiO_2$), Magnesium Oxide (MgO), Silicon Nitride ($SiN_x$), Aluminum Oxide ($Al_2O_3$), Aluminum Nitride ($AlN_x$) and Tantalum Oxide ($TaO_x$). In at least one embodiment, the intermediate layer 210 is Aluminum Oxide.

In at least one other embodiment, the SVM cell 202 is a GMR or CMR cell wherein the intermediate layer 210 is made from a non-magnetic material such as a $3d$, a $4d$, or a $5d$ transition metal listed in the periodic table of the elements. Suitable non-magnetic materials for a non-magnetic intermediate layer 210 may include, but are not limited to: Copper (Cu), Gold (Au) and Silver (Ag). In at least one embodiment, the intermediate layer 210 is Copper.

The ferromagnetic data layer 208 and the reference layer 212 may be made from a material that includes, but is not limited to: Nickel Iron (NiFe), Nickel Iron Cobalt (NiFeCo), Cobalt Iron (CoFe), and alloys of such metals. More specifically, in at least one embodiment the data layer 208 and the reference layer 212 are Nickel Iron (NiFe). In addition, the first conductor 204 and second conductor 206 may be made from materials that include, but are not limited to, Copper (Cu), Gold (Ag), Silver (Au).

While the actual thickness of the intermediate layer 210 is dependent upon the materials selected to create the intermediate layer 210 and the type of tunnel memory cell desired, in general, the intermediate layer 210 has a thickness of about 0.5 nm to about 5.0 nm. However, under appropriate circumstances this thickness may be increased or decreased.

The application of voltage potentials V1, V2, V3 and V4 occurs substantially contemporaneously. This is illustrated by operations 402 through 414 being placed between parallel lines 416 and 418 in FIG. 4. As a result the heating of the SVM cell 202 occurs substantially contemporaneously with the application of the first write magnetic field 500 and the application of the second write magnetic field 502. The combined first and second magnetic fields 500, 502 are greater than the coercivity of the heated SVM cell 202, such that the orientation of magnetization M1 of the data layer 208 may be to align with the first and second applied magnetic fields 500, 502, as shown in operation 420. In contrast, if the SVM cell 220 is not heated to the threshold temperature, the same voltages providing the same magnetic fields would be insufficient to change the orientation of magnetization M1.

The application of heat 366 contemporaneous with the application of the combined magnetic fields (500, 502) is advantageous as the effects of environmental factors upon the SVM cell 202 are reduced. In addition, whereas pulse heating operates in a heat first, write second process, contemporaneous heating advantageously permits the proper elevated temperature to be maintained throughout the write operation. The improved write operation characteristics are advantageously achieved without increasing the relative size or complexity of the memory device, such as cross-point array 300. As such, low fabrication cost and high SVM cell density are maintained, if not improved.

In at least one embodiment, the four voltage potentials (V1–V4) are maintained for a duration of time, specifically a duration of time sufficient for the combined first write magnetic field 500 and second write magnetic filed 502 to orient M1. The potential V2 is then removed from the second end 224 of the first conductor 204, operation 422. The removal of V2 removes the presence of the first write magnetic field 500.

The potential V1 is then removed from the first end 222 of the first conductor 204, operation 424. The removal of V1 removes the presence of the heating potential and removes I_heat 364 from flowing through SVM cell 202. The internal heat 366 of SVM cell 202 may be sufficient that the coercivity of SVM cell 202 is susceptible to the remaining second write magnetic field 502. The potentials V3 and V4 are removed from the second conductor 206, operation 426.

Although the heating current I_heat 364 is provided by the voltage potentials establishing the first and second write currents, I_col 360 and I_row 362, the heating current I_heat 364 operates independently. More specifically, I_heat 364 is not a required current component for either I_col 360 or I_row 362 to establish the first write magnetic field 500 or the second write magnetic field 502.

Figure 6A:
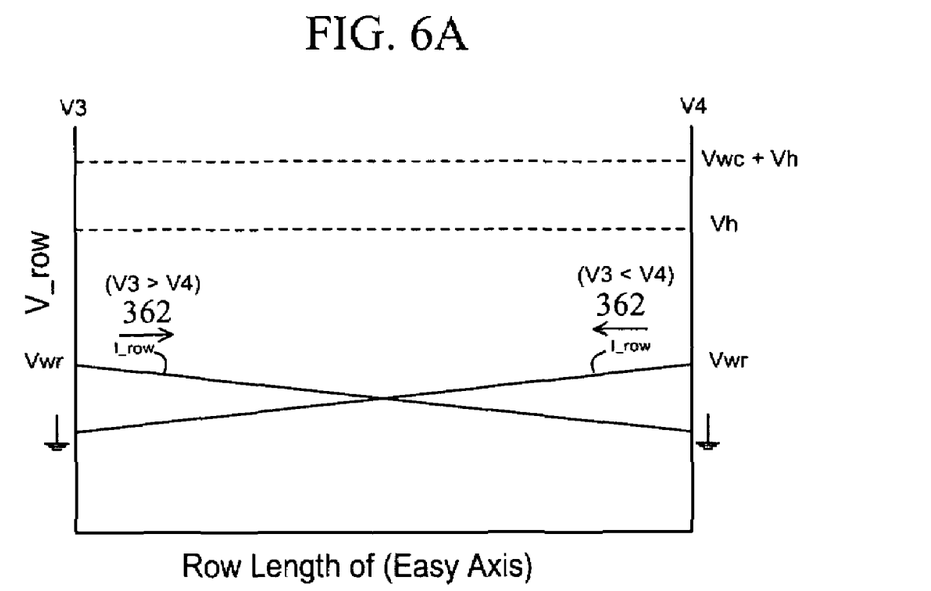
FIGS. 6A and 6B provide charts depicting the relative voltage potentials applied during a write operation, according to one embodiment.
Figure 6B:
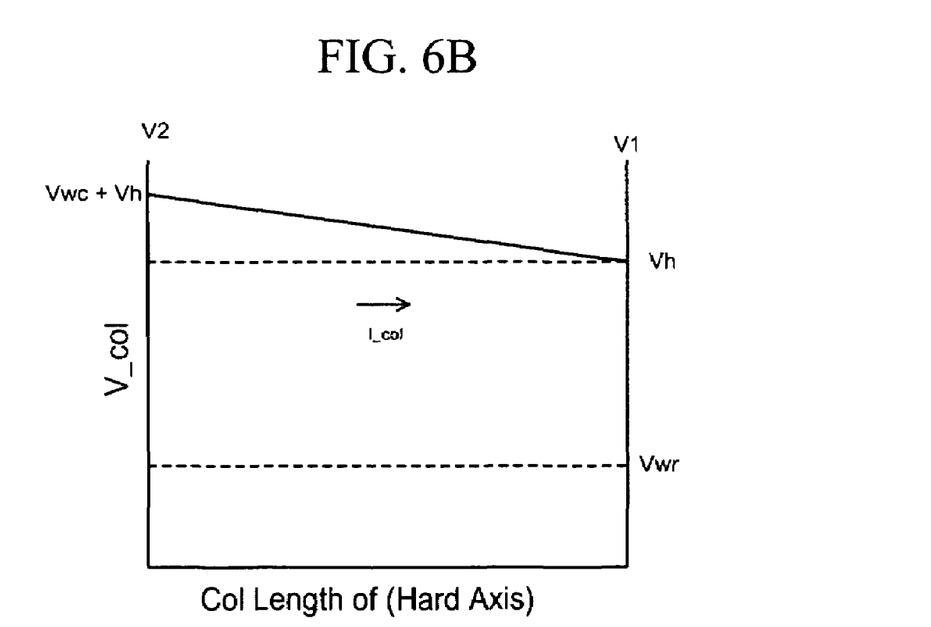

The graphs provided in FIGS. 6A and 6B conceptually illustrate the relationships between the four voltage potentials V1–V4. FIG. 6A illustrates the current I_row 362 as it flows through the second conductor 206. As illustrated I_row 362 may flow in either direction depending upon which voltage potential is greater, V3 or V4. As shown, V3 or V4 may be substantially about a ground potential. The dotted lines of Vwc+Vh and Vh illustrate the relative potential differences between V3, V4 and V1, V2.

FIG. 6B illustrates the current I_col 360 as it flows through the first conductor 204. In both charts, Vwc is effectively elevated above Vwr by Vh. Moreover, absent Vh, the relative potential in the first conductor 204 may be substantially equivalent to the potential in the second conductor 206.

Figure 7A:
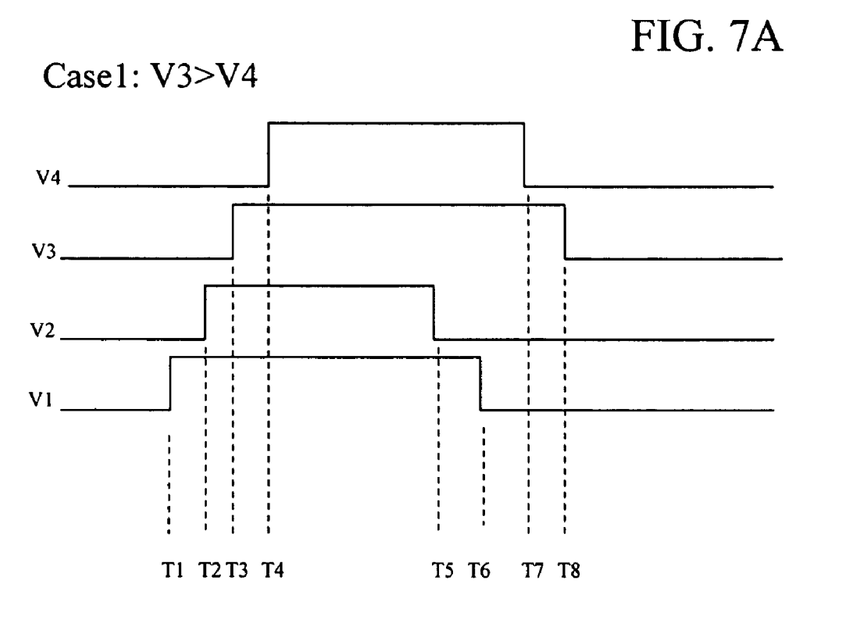
FIGS. 7A and 7B provide charts illustrating the application and removal of voltage potentials directed in the operations of FIG. 4.
Figure 7B:
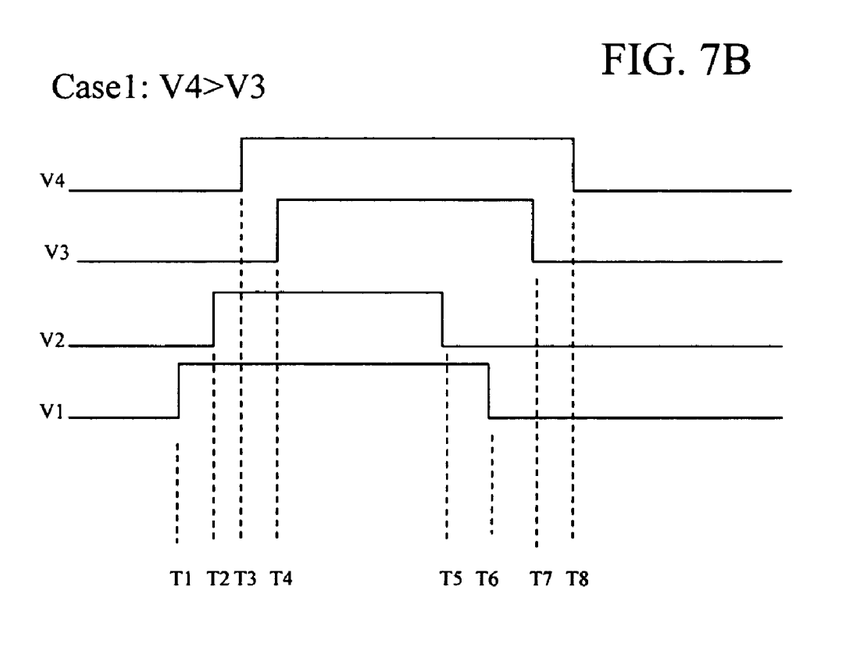

The charts provided in FIGS. 7A and 7B conceptually illustrate the temporal alignments of the application and removal of the four voltage potentials V1–V4. The vertical rise and fall in each line associated with V1 through V4 is intended to illustrate application or removal of the voltage potential. More specifically, FIG. 7A illustrates a case where the potential of V1 is greater than the potential of V2.

As is shown, in at least one embodiment V1 is applied at time T1 and V2 is applied at time T2, followed by V3 at T3 and V4 at T4. In FIG. 7A it may be fully appreciated that all four voltages are contemporaneously applied between time T4 and time T5, indicating that both heat 366 and magnetic fields 500, 502 are applied to the selected SVM cell 202. The illustrated order of removal for the applied potentials aids in maintaining the oriented alignment of M1.

FIG. 7B strongly parallels FIG. 7A with the noted exception that V3 is greater than V4. As such, V4 is applied at time T3 and V3 is applied at T4. The order of removal is reversed as well.

Another embodiment may be appreciated to be a data storage device including at least one the thermally assisted two conductor SVM cell 202 and a control logic write circuit operable to apply four voltage potentials to the at least one SVM cell 202 in accordance with the above description. A computer with a main board, CPU and at least one memory store comprised of an embodiment of such a device raises the advantages of the improved thermally assisted two conductor write method to a system level.

Changes may be made in the above methods, systems and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

We claim:

1. A method of performing a thermally assisted write operation on a selected two conductor spin valve memory (SVM) cell providing an alterable orientation of magnetization in a material providing a stable orientation and high coercivity below a threshold temperature, and an alterable orientation and low coercivity above a threshold temperature, the method comprising:

applying a first differential voltage across a first conductor generating a first write magnetic field;

applying a second differential voltage across a second conductor generating a second write magnetic field, the second differential voltage applied contemporaneously with the first differential voltage;

contemporaneously heating the SVM cell above a threshold temperature with a heating current flowing from the first conductor to the second conductor through the SVM cell, the SVM cell having a resistive property providing internal self heating to the SVM cell; and orienting the magnetization of the SVM cell, the combined first and second write fields being greater than the coercivity of the heated SVM cell such that the orientation of the magnetization of the SVM cell may be changed to align with the applied first and second magnetic fields.

2. The method of claim 1, further including selecting a given SVM cell.

3. The method of claim 1, wherein the SVM cell has a hard axis oriented transverse in relationship to an easy axis, the first conductor being parallel to the easy axis such that in operation the first write magnetic field is applied along the hard axis.

4. The method of claim 1, wherein the SVM cell has a hard axis oriented transverse in relationship to an easy axis, the second conductor being parallel to the hard axis such that in operation the second write magnetic field is applied along the easy axis.

5. A method of performing a thermally assisted write operation on a selected two conductor spin valve memory (SVM) cell having a data layer presenting an alterable orientation of magnetization in a material providing a stable orientation and high coercivity below a threshold temperature, and an alterable orientation and low coercivity above a threshold temperature, the method comprising:

applying a first voltage potential to a first end of a first conductor;

applying a second voltage potential to a second end of the first conductor; the second voltage potential being higher than the first voltage potential such that a first current flows in the first conductor providing a first write magnetic field;

applying a third voltage potential to a first end of a second conductor, the third voltage potential being less than the first voltage potential;

applying a fourth voltage potential to a second end of the second conductor, the fourth voltage potential being less than the first voltage potential and unequal to the third voltage potential such that a second current flows in the second conductor providing a second write magnetic field;

heating the SVM cell above a threshold temperature with a heating current flowing from the first conductor to the second conductor through the SVM cell from the high potential of the first conductor to the lower potential of the second conductor, the SVM cell having a resistive property providing internal self heating to the SVM cell; and orienting the magnetization of the SVM cell, the combined first and second write fields being greater than the coercivity of the heated SVM cell such that the orientation of the magnetization of the data layer may be changed to align with the applied first and second magnetic fields.

6. The method of claim 5, further including selecting a given SVM cell.

7. The method of claim 5, wherein the data layer has a hard axis oriented transverse in relationship to an easy axis, the first conductor being parallel to the easy axis such that in operation the first write magnetic field is applied along the hard axis.

8. The method of claim 5, wherein the data layer has a hard axis oriented transverse in relationship to an easy axis, the second conductor being parallel to the hard axis such that in operation the second write magnetic field is applied along the easy axis.

9. The method of claim 5, further comprising:
maintaining the four voltage potentials simultaneously for a duration of time;
removing the second voltage potential to remove the first current and the first write magnetic field;
removing the first voltage potential to remove the third current flowing from the first conductor through the SVM cell to the second conductor;
removing the third and fourth voltage potentials to remove the second current and the second write magnetic field.

10. The method of claim 5, wherein the third voltage potential is greater than the fourth voltage potential.

11. The method of claim 5, wherein the fourth voltage potential is greater than the third voltage potential.

12. The method of claim 5, wherein the at least three of the four applied voltage potentials are above a ground potential.

13. The method of claim 5, wherein the SVM cell has a high breakdown voltage.

14. The method of claim 5, wherein the SVM cell has a breakdown voltage greater than either the first or second heater potential.

15. The method of claim 5, wherein the first, second, third and fourth voltage potentials are applied contemporaneously.

16. The method of claim 5, wherein the heating of the SVM cell occurs contemporaneously with the application of the first and second write magnetic fields to the SVM cell.

17. The method of claim 5, wherein the SVM cell is coupled in series to a resistive heater device, the heating of the SVM cell including radiant heat provided by the resistive heater device in addition to the internal self heating.

18. A method of performing a thermally assisted write operation on a selected two conductor spin valve memory (SVM) cell presenting an alterable orientation of magnetization in a material providing a stable orientation and high coercivity below a threshold temperature, and an alterable orientation and low coercivity above a threshold temperature, the method comprising:
applying a first write current through a first conductor to provide a first write magnetic field, the first write current established by providing a first voltage potential to a first end of the first conductor and a second voltage potential to a second end of the first conductor;

applying a second write current through a second conductor to provide a second write magnetic field, the second write current established by providing a third voltage potential to a first end of the second conductor and a fourth voltage potential to a second end of the second conductor, the third and fourth voltage potentials being less than either of the first and second voltage potentials such that the first conductor has a higher voltage potential than the second conductor;

heating the SVM cell above a threshold temperature with a heating current flowing from the first conductor to the second conductor through the SVM cell from the high potential of the first conductor to the lower potential of the second conductor, the SVM cell having a resistive property providing internal self heating to the SVM cell; and orienting the magnetization of the SVM cell, the combined first and second write fields being greater than the coercivity of the heated SVM cell such that the orientation of the magnetization of the SVM cell may be changed to align with the applied first and second magnetic fields.

19. The method of claim 18, further including selecting a given SVM cell.

20. The method of claim 18, wherein the SVM cell has a hard axis oriented transverse in relationship to an easy axis, the first conductor being parallel to the easy axis such that in operation the first write magnetic field is applied along the hard axis.

21. The method of claim 18, wherein the SVM cell has a hard axis oriented transverse in relationship to an easy axis, the second conductor being parallel to the hard axis such that in operation the second write magnetic field is applied along the easy axis.

22. The method of claim 18, further comprising:
maintaining the four voltage potentials simultaneously for a duration of time;
removing the second voltage potential to remove the first current and the first write magnetic field;
removing the first voltage potential to remove the third current flowing from the first conductor through the SVM cell to the second conductor;
removing the third and fourth voltage potentials to remove the second current and the second write magnetic field.

23. The method of claim 18, wherein at least three of the applied voltage potentials are above a ground potential.

24. The method of claim 18, wherein the SVM cell has a high breakdown voltage.

25. The method of claim 18, wherein the SVM cell has a breakdown voltage greater than either the first or second heater potential.

26. The method of claim 18, wherein the first, second, third and fourth voltage potentials are applied contemporaneously.

27. The method of claim 18, wherein the heating of the SVM cell occurs contemporaneously with the application of the first and second write magnetic fields to the SVM cell.

28. The method of claim 18, wherein the SVM cell is coupled in series to a resistive heater device, the heating of the SVM cell including radiant heat provided by the resistive heater device in addition to the internal self heating.

29. A data storage device comprising:
at least one spin valve memory (SVM) cell having a top and a bottom, the SVM cell providing an alterable orientation of magnetization in a material wherein the coercivity is decreased upon an increase in temperature, the orientation of magnetization having an easy axis and a hard axis;

a first electrical conductor electrically coupled to the top of the SVM cell transverse to the easy axis of the SVM cell, the first electrical conductor having a first and a second end;

a second electrical conductor electrically coupled to the bottom of the SVM cell opposite from the first electrical conductor; the second electrical conductor having a first and a second end; and a control logic write circuit switchably coupled to the first and second electrical conductors of a given SVM cell, the write circuit operable during a write operation such that:

a first voltage potential is applied to the first end of the first conductor;

a second voltage potential is applied to the second end of the first conductor; the second voltage potential being higher than the first voltage potential such that a first current flows in the first conductor providing a first write magnetic field;

a third voltage potential is applied to the first end of the second conductor, the third voltage potential being less than the first voltage potential;

a fourth voltage potential is applied to the second end of the second conductor, the fourth voltage potential being less than the first voltage potential and unequal to the third voltage potential such that a second current flows in the second conductor providing a second write magnetic field and such that the first conductor has a higher potential than the second conductor;

the SVM cell is heated above a threshold temperature with a heating current flowing from the first conductor to the second conductor through the SVM cell, the SVM cell having a resistive property providing internal self heating to the SVM cell; and orienting the magnetization of the data layer, the combined first and second write fields being greater than the coercivity of the heated SVM cell such that the magnetic orientation may be changed.

30. The data storage device of 29, wherein at least three of the applied voltage potentials are above a ground potential.

31. The data storage device of 29, wherein the SVM cell has a high breakdown voltage.

32. The data storage device of 29, wherein the SVM cell has a breakdown voltage greater than either the first or second heater potential.

33. The data storage device of 29, wherein the first, second, third and fourth voltage potentials are applied contemporaneously.

34. The data storage device of 29, wherein the heating of the SVM cell occurs contemporaneously with the application of the first and second write magnetic fields to the SVM cell.

* * * * *